(12) United States Patent
Yang et al.

(10) Patent No.: US 10,564,553 B2
(45) Date of Patent: Feb. 18, 2020

(54) LARGE LOAD-BEARING GUIDE MECHANISM AND MULTI-DOF LARGE-STROKE HIGH-PRECISION MOTION PLATFORM SYSTEM

(71) Applicant: GUANGDONG UNIVERSITY OF TECHNOLOGY, Guangzhou (CN)

(72) Inventors: Zhijun Yang, Guangzhou (CN); Qian Li, Guangzhou (CN); Youdun Bai, Guangzhou (CN); Xin Chen, Guangzhou (CN); Xun Chen, Guangzhou (CN); Yaobin He, Guangzhou (CN); Han Sun, Guangzhou (CN); Guanxin Huang, Guangzhou (CN); Baisheng Wu, Guangzhou (CN)

( * ) Notice: Subject to any disclaimer, the term of this patent is extended or adjusted under 35 U.S.C. 154(b) by 186 days.

(21) Appl. No.: 15/853,847

(22) Filed: Dec. 24, 2017

(65) Prior Publication Data

US 2019/0094714 A1  Mar. 28, 2019

(30) Foreign Application Priority Data

Sep. 26, 2017 (CN) .......................... 2017 1 0881691
Sep. 26, 2017 (CN) .......................... 2017 1 0883865

(51) Int. Cl.
G03F 7/00 (2006.01)
G03F 7/20 (2006.01)
F16C 11/12 (2006.01)
B23Q 1/44 (2006.01)
B23Q 1/36 (2006.01)

(52) U.S. Cl.
CPC .......... *G03F 7/70716* (2013.01); *B23Q 1/36* (2013.01); *B23Q 1/445* (2013.01); *F16C 11/12* (2013.01); *G03F 7/70758* (2013.01); *H02K 2201/18* (2013.01)

(58) Field of Classification Search
CPC ... G03F 7/70716; G03F 7/70758; B23Q 1/36; B23Q 1/445; F16C 11/12; H02K 2201/18
See application file for complete search history.

(56) References Cited

U.S. PATENT DOCUMENTS 4,691,586 A * 9/1987 van Leijenhorst ....... B23Q 1/36
248/251
5,165,205 A * 11/1992 Nakagawa ............... B23Q 1/34
366/108
5,297,130 A * 3/1994 Tagawa .................. G01Q 10/04
369/126

(Continued)

FOREIGN PATENT DOCUMENTS

WO WO-2015176444 A1 * 11/2015 ............... B23Q 1/62

*Primary Examiner* — Zakaria Elahmadi
(74) *Attorney, Agent, or Firm* — Erson IP (Nelson IP)

(57) ABSTRACT

The present invention also discloses a multi-DOF (Degree of Freedom) large-stroke high-precision motion platform system using the guide mechanism. A large load-bearing guide mechanism comprises: a rigid frame for generating a large-stroke displacement to realize high-speed motion; a core motion platform connected with a motion portion of a non-contact actuator, connected with the rigid frame by a primary flexible hinge group and a secondary flexible hinge group, and used for generating a small-stroke precise displacement by elastic deformation of the flexible hinge groups under driving of the actuator.

13 Claims, 13 Drawing Sheets

(56) References Cited

U.S. PATENT DOCUMENTS

| | | | | |
|---|---|---|---|---|
| 5,623,853 | A * | 4/1997 | Novak | G03F 7/70358 |
| | | | | 74/490.09 |
| 5,834,864 | A * | 11/1998 | Hesterman | B82Y 35/00 |
| | | | | 310/40 MM |
| 6,353,271 | B1 * | 3/2002 | Williams | G03F 7/707 |
| | | | | 310/12.06 |
| 10,388,850 | B2 * | 8/2019 | Chen | H01L 41/09 |
| 2003/0086751 | A1 * | 5/2003 | Culpepper | F16C 11/12 |
| | | | | 403/52 |
| 2003/0174304 | A1 * | 9/2003 | Galburt | G03F 7/70758 |
| | | | | 355/72 |
| 2004/0195920 | A1 * | 10/2004 | Matsumoto | H02K 41/0354 |
| | | | | 310/12.25 |
| 2005/0128449 | A1 * | 6/2005 | Phillips | G03F 7/70716 |
| | | | | 355/53 |
| 2008/0192226 | A1 * | 8/2008 | Shibazaki | G03F 7/70716 |
| | | | | 355/72 |
| 2012/0057140 | A1 * | 3/2012 | Aoki | G03F 7/70716 |
| | | | | 355/53 |
| 2013/0038853 | A1 * | 2/2013 | Zhu | G03F 7/70716 |
| | | | | 355/72 |
| 2016/0153492 | A1 * | 6/2016 | Bauce | F16C 43/00 |
| | | | | 310/90.5 |
| 2017/0277041 | A1 * | 9/2017 | Okwudire | G03F 7/70725 |

* cited by examiner

LARGE LOAD-BEARING GUIDE MECHANISM AND MULTI-DOF LARGE-STROKE HIGH-PRECISION MOTION PLATFORM SYSTEM

CROSS-REFERENCE TO RELATED APPLICATIONS

This application claims priority to Chinese Patent Application No. 201710883865.0 with a filing date of Sep. 26, 2017 and No. 201710881691.4 with a filing date of Sep. 26, 2017. The content of the aforementioned applications, including any intervening amendments thereto, are incorporated herein by reference.

TECHNICAL FIELD

The present invention relates to the technical field of precise motion platforms, and particularly relates to a large load-bearing guide mechanism and a multi-DOF (Degree of Freedom) large-stroke high-precision motion platform system using the guide mechanism.

BACKGROUND OF THE PRESENT INVENTION

With progress of science and technology, people have increasingly high requirements for products so that manufacturers also have increasingly high requirements for processing precision of the products. Existing high-precision feed motion platform systems generally have relatively short strokes, and precision of an ordinary large-stroke macro-motion system cannot meet actual demands. If a special large-stroke high-precision motion platform system is adopted, production cost of the products will be increased greatly. In view of the above situation, a motion platform system capable of realizing large-stroke high-precision feed by combining large-stroke general-precision macro-motion with high-precision small-stroke micro-motion and having multiple directions is more and more popular in the industry.

SUMMARY OF PRESENT INVENTION

In view of defects that an ordinary large-stroke macro-motion device has relatively low precision while a high-precision feed motion platform generally has a relatively short stroke, and a maximum motion DOF of the motion platform system is only two degrees in the prior art, the present invention provides a large load-bearing guide mechanism and a multi-DOF large-stroke high-precision motion platform system.

For the above technical problems, the present invention proposes the following technical solutions:

In one aspect, a large load-bearing guide mechanism is provided, comprising: a rigid frame (102) for generating a large-stroke displacement to realize high-speed motion; a core motion platform (104) arranged in the rigid frame (102) and used for generating a small-stroke precise displacement in the rigid frame (102) under driving of a non-contact actuator; a primary flexible hinge group (106) arranged between the rigid frame (102) and both sides of the core motion platform (104), and used for connecting the core motion platform (104) to the rigid frame (102), supporting a load of the core motion platform (104) and making the core motion platform generate a precise displacement through deformation along a motion direction; and a secondary flexible hinge group (108) disposed between the rigid frame (102) and the other two sides of the core motion platform (104), arranged perpendicular to the primary flexible hinge group, and used for connecting the core motion platform (104) to the rigid frame (102), improving torsional deformation resistance of the core motion platform and allowing the core motion platform to generate a displacement along the motion direction, wherein flexible hinges of the secondary flexible hinge group (108) are arranged symmetrically relative to the core motion platform (104); and the flexible hinges of the primary flexible hinge group (106) are arranged symmetrically relative to the core motion platform (104).

Preferably, the rigid frame (102), the core motion platform (104) and the primary flexible hinge group (106) are integrally formed.

Preferably, the rigid frame (102), the core motion platform (104) and the primary flexible hinge group (106) are made of aviation aluminum or aviation aluminum alloy.

Preferably, the secondary flexible hinge group (108) and the rigid frame (102) are integrally formed.

Preferably, the guide mechanism further comprises a rigid connecting portion (110); and the core motion platform (104) is connected with the secondary flexible hinge group (108) by the rigid connecting portion (110).

Preferably, the secondary flexible hinge group (108), the core motion platform (104) and the rigid connecting portion (110) are integrally formed.

Preferably, the secondary flexible hinge group (108), the rigid frame (102), the core motion platform (104) and the rigid connecting portion (110) are made of aviation aluminum or aviation aluminum alloy.

Preferably, an opening communicated with the secondary flexible hinge group (108) is formed in the rigid frame (102); and the guide mechanism further comprises a rigid block (118) embedded into the opening and rigidly connected with the rigid frame (102) to increase rigidity of a weak portion generated by the rigid frame (104) because of machining the secondary flexible hinge group (108).

In another aspect, a multi-DOF large-stroke high-precision motion platform system is provided, comprising a first rotating component (100a), a second rotating component (100b), a sliding component (200), a first single-DOF motion platform, a second single-DOF motion platform and a third single-DOF motion platform, wherein each of the single-DOF motion platforms comprises a base (20), a non-contact actuator (30) and the above guide mechanism; the first rotating component (100a) and the sliding component (200) form a rotational sliding motion pair; the rotational sliding motion pair is rigidly connected with the core motion platform (104a) in the first single-DOF motion platform and is rigidly connected with a base (114c) in the third single-DOF motion platform; and the second rotating component (100b) is rigidly connected with a core motion platform (104b) in the second single-DOF motion platform and is rigidly connected with the base (114c) in the third single-DOF motion platform.

Preferably, the multi-DOF large-stroke high-precision motion platform further comprises a first connecting piece (400a) and a second connecting piece (400b); the rotational sliding motion pair is rigidly connected with the base (114c) in the third single-DOF motion platform by the first connecting piece (400a); and the second rotating component (100b) is rigidly connected with the base (114c) in the third single-DOF motion platform by the second connecting piece (400b).

Preferably, both the first rotating component (100a) and the second rotating component (100b) are cross roller shaft rings.

Preferably, the sliding component (200) is a short linear guide rail platform.

Preferably, each of the single-DOF motion platforms further comprises a linear guide rail (40); the rigid frame (102) and the base (20) form sliding pair connection by the linear guide rail (40); the core motion platform (104) is connected with a motion portion of the non-contact actuator (30); and a fixed portion of the non-contact actuator (30) is rigidly connected with the base (20).

Preferably, both the first single-DOF motion platform and the second single-DOF motion platform are arranged on a base (500).

Implementation of embodiments of the present invention brings the following beneficial effects: 1. the multi-DOF large-stroke high-precision motion platform with a required DOF can be flexibly constructed according to specific requirements; and 2. each of single-DOF large-stroke high-precision motion platform assemblies is machined and manufactured in a general machining manner without using air flotation, magnetic levitation and other special components so that the cost is relatively low.

DESCRIPTION OF THE DRAWINGS

In order to describe the technical solutions in embodiments of the present invention or in the prior art more clearly, drawings required for descriptions in embodiments or the prior art are simply introduced below. Apparently, the drawings in the following descriptions are only some embodiments of the present invention. Those ordinary skilled in the art can also obtain other drawings based on these drawings without contributing creative work.

DETAILED DESCRIPTION OF PREFERRED EMBODIMENTS

Figure 1:
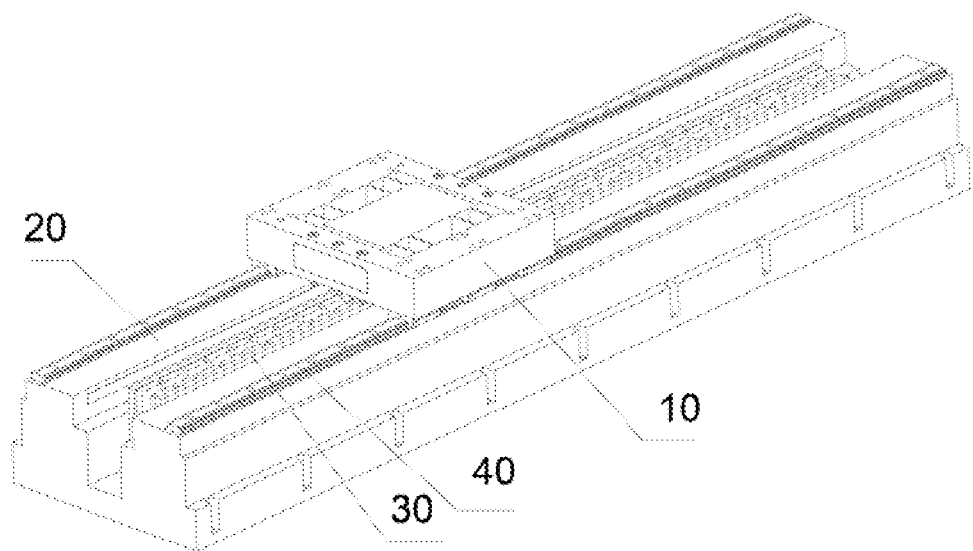
FIG. 1 is a schematic diagram of a single-DOF motion platform.

The technical solutions in embodiments of the present invention will be described clearly and completely with reference to the drawings in embodiments of the present invention. Apparently, the described embodiments are only some but not all embodiments of the present invention. All other embodiments obtained by those ordinary skilled in the art based on embodiments of the present invention without contributing creative work should fall within a protection scope of the present invention. The drawings are only used for exemplary description and should not be construed to limit the present patent. In order to better illustrate the present embodiment, some components in the drawings may be omitted, enlarged or reduced, and do not represent actual dimensions of products. It can be understood by those skilled in the art that some well-known structures and descriptions thereof in the drawings may be omitted. Descriptions of positional relationships in the drawings are only used for exemplary description and should not be construed to limit the present patent.

In the whole drawings, if similar numbers exist, then the similar numbers represent similar components. In description and claims, unless explicitly defined, "a", "the" or indefinite quantity represents that the quantity of components may be single or multiple. Similarly, in the description and the claims, unless explicitly defined, "on" comprises "in" and "above". In addition, in order to facilitate reading, titles or subheadings may also be used in the description without affecting the scope of the description.

For example, "about", "approximate", "nearly" and other words used in the present patent should be construed to fall within a scope of 20% of a given value, preferably 10%, more preferably 5%.

For example, "a plurality of" used in the present patent represents two or more.

For example, "comprise", "contain", "have", "with" or similar words used in the present patent should be construed to be open-ended, i.e., represent including but not limited to.

Embodiment 1 Motion Platform System

Figure 2:
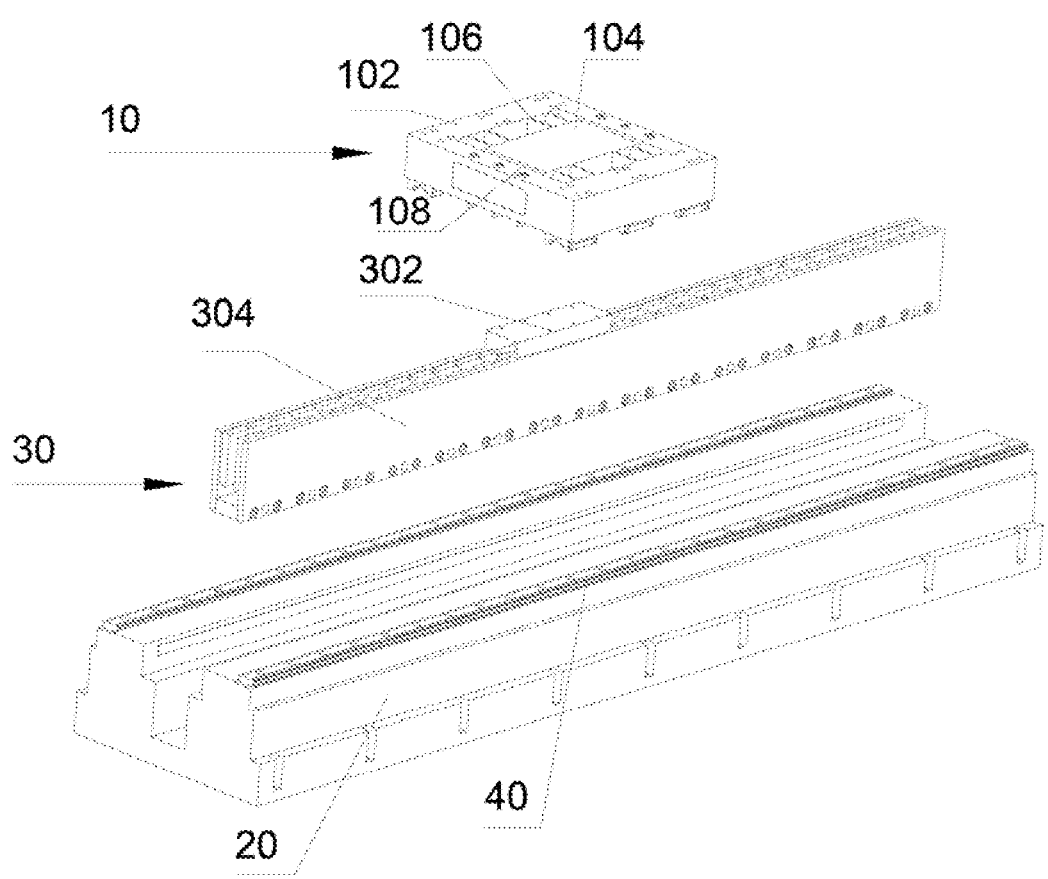
FIG. 2 is an exploded schematic diagram of a single-DOF motion platform.

As shown in FIGS. 1 and 2, a single-DOF motion platform comprises a guide mechanism 10, a base 20, a non-contact actuator 30 and a linear guide rail 40, wherein the guide mechanism 10 comprises a rigid frame 102, a core motion platform 104, a primary flexible hinge group 106 and a secondary hinge group 108. The rigid frame 102 and the base 20 form sliding pair connection by the linear guide rail 40. The core motion platform 104 in a large load-bearing guide mechanism 10 is connected with a motion portion 302 of the non-contact actuator 30, so as to drive the core motion platform 104 to generate a displacement under a rigidity constraint of the primary flexible hinge group 106. A fixed portion 304 of the non-contact actuator 30 is rigidly connected with the base 20.

Figure 3:
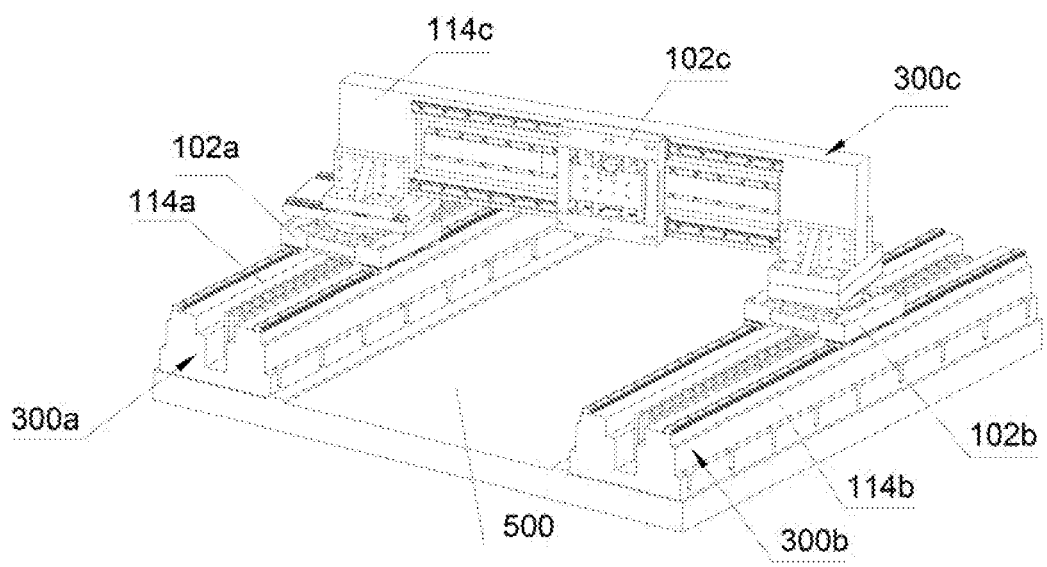
FIG. 3 is an overall schematic diagram of a three-DOF motion platform.
Figure 4:
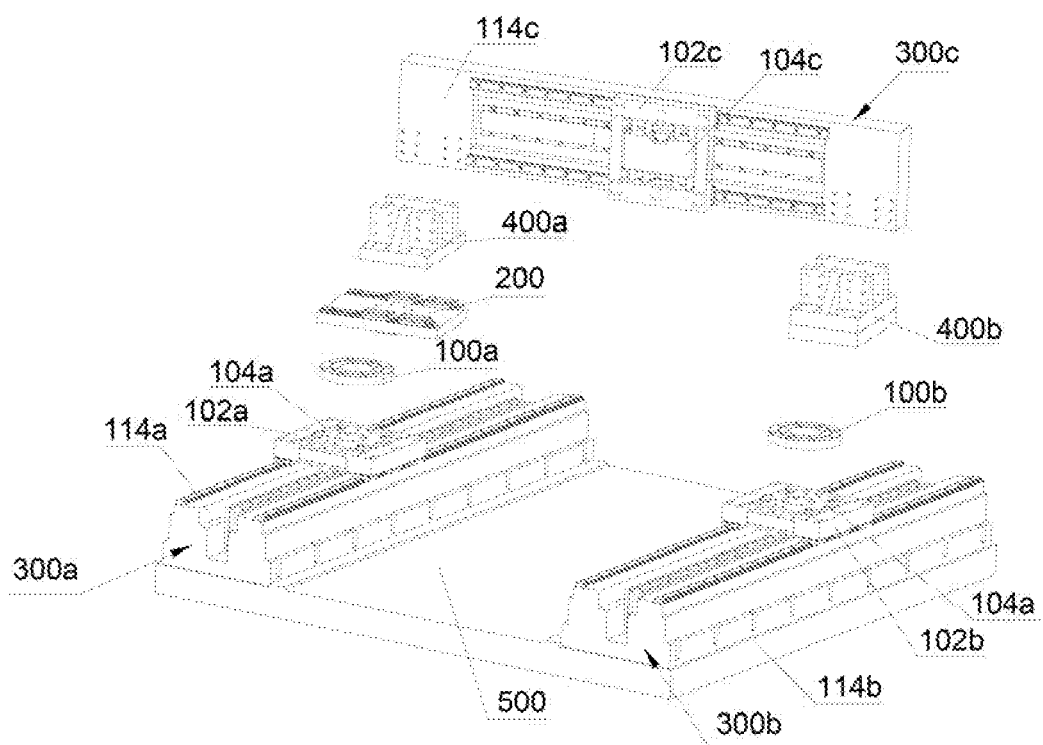
FIG. 4 is an exploded schematic diagram of a three-DOF motion platform.
Figure 5:
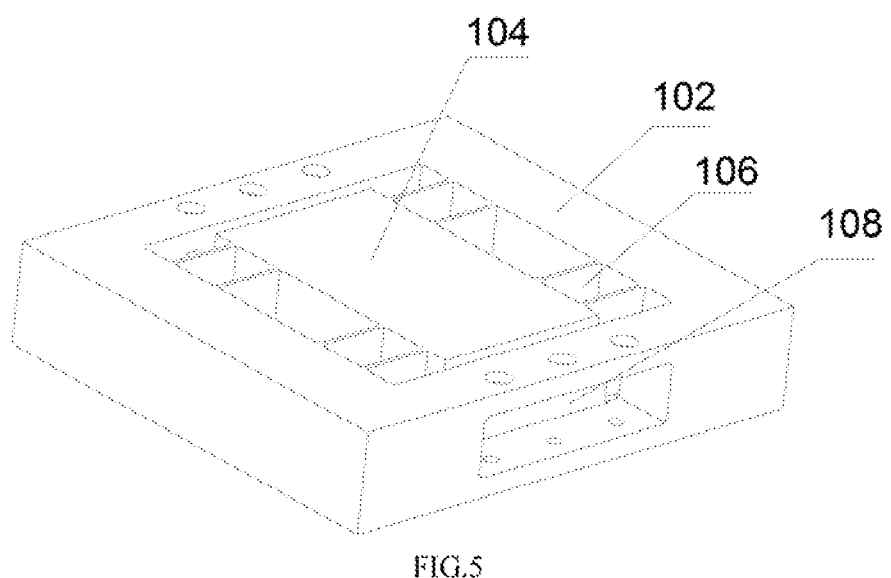
FIG. 5 is a schematic diagram of a guide mechanism.

A multi-DOF large-stroke high-precision motion platform system is a three-DOF motion platform system, as shown in FIG. 3 and FIG. 4. The three-DOF motion platform system shown in FIGS. 3 and 4 comprises three identical single-DOF motion platforms 300a, 300b and 300c, a first rotating component 100a, a second rotating component 100b and a sliding component 200. The first rotating component 100a and the sliding component 200 form a rotational sliding motion pair. The rotational sliding motion pair is rigidly connected with the core motion platform 104a in the first single-DOF motion platform 300a and is rigidly connected with a base 114c in a third single-DOF motion platform 300c. The second rotating component 100a is rigidly connected with the core motion platform 104b in a second single-DOF motion platform 300b and is rigidly connected with the base 114c in the third single-DOF motion platform 300c. In the present embodiment, both the first rotating component 100a and the second rotating component 100b are cross roller shaft rings. The sliding component 200 is a short linear guide rail platform. The multi-DOF long-stroke high-precision motion platform further comprises a first connecting piece 400a and a second connecting piece 400b. The above rotational sliding motion pair is rigidly connected with the core motion platform 104a in the single-DOF motion platform 300a and is rigidly connected with the base 114c in the third single-DOF motion platform 300c by the first connecting piece 400a. A rotating pair is rigidly connected with the core motion platform 104b in the single-DOF motion platform 300b and is rigidly connected with the base 114c in the third single-DOF motion platform 300c by the second connecting piece 400b. Both the first single-DOF motion platform 300a and the second single-DOF motion platform 300b are arranged on a base 500.

The core motion platforms 104a and 104b in the first single-DOF motion platform 300a and the second single-DOF motion platform 300b can realize motion in two DOF directions of unidirectional linear motion and deflection motion of the base 114c in the third single-DOF motion platform 300c in a differential motion manner. The core motion platform 104c in the third single-DOF motion platform 300c can realize the motion in a third DOF direction along a linear guide rail fixed on the base 114c. In the above manner, the three-DOF motion platform of the present invention can realize x-y-z three-DOF motion.

Embodiment 2 Guide Mechanism

Further, as shown in FIGS. 5-9, the present embodiment provides a specific structure of the guide mechanism. A main difference between the guide mechanism and an existing flexible hinge guide mechanism is addition of a secondary flexible hinge 108 for bearing a large load and resisting deformation in a non-working direction. The guide mechanism of the present embodiment comprises a rigid frame 102 for generating a large-stroke displacement to realize high-speed motion; a core motion platform 104 arranged in the rigid frame 102 and used for generating a small-stroke precise displacement in the rigid frame 102 under driving of a non-contact actuator; a primary flexible hinge group 106 arranged between the rigid frame 102 and both sides of the core motion platform 104, and used for connecting the core motion platform 104 to the rigid frame 102, supporting a load of the core motion platform 104 and making the core motion platform 104 generate a precise displacement through deformation along a motion direction; and the secondary flexible hinge group 108 disposed between the rigid frame 102 and the other two sides of the core motion platform 104, arranged perpendicular to the primary flexible hinge group 106, and used for connecting the core motion platform 104 to the rigid frame 102, improving torsional deformation resistance of the core motion platform and allowing the core motion platform to generate a displacement along the motion direction. The secondary flexible hinge group 108 is arranged along the motion direction of the core motion platform 104. The primary flexible hinge group 106 is arranged along the motion direction perpendicular to the core motion platform 104. Flexible hinges of the secondary flexible hinge group 108 are arranged symmetrically relative to the core motion platform 104. The flexible hinges of the primary flexible hinge group 106 are arranged symmetrically relative to the core motion platform 104.

Figure 6A:
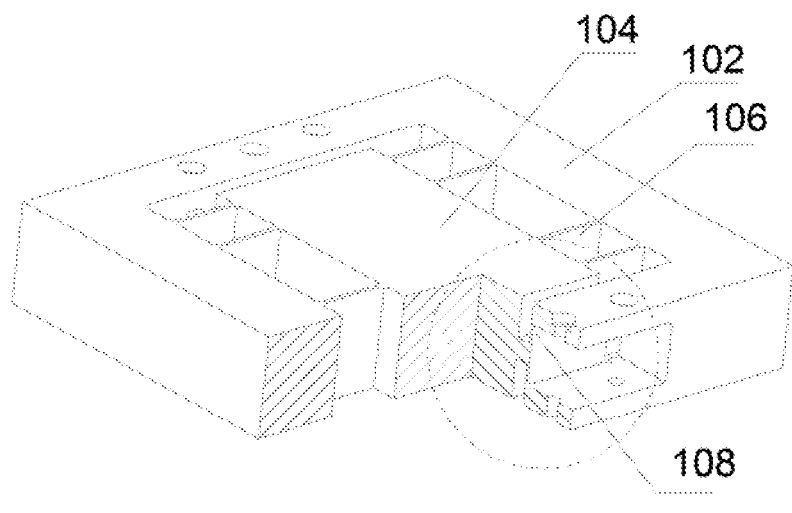
FIGS. 6a and 6b are an axial sectional view and a local enlarged view of a guide mechanism.
Figure 6B:
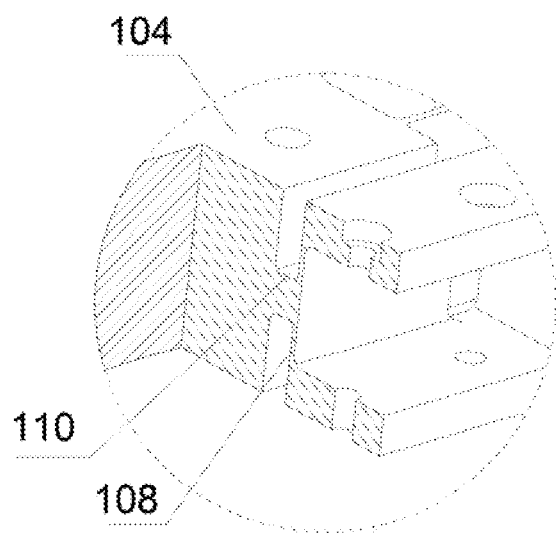
Figure 7A:
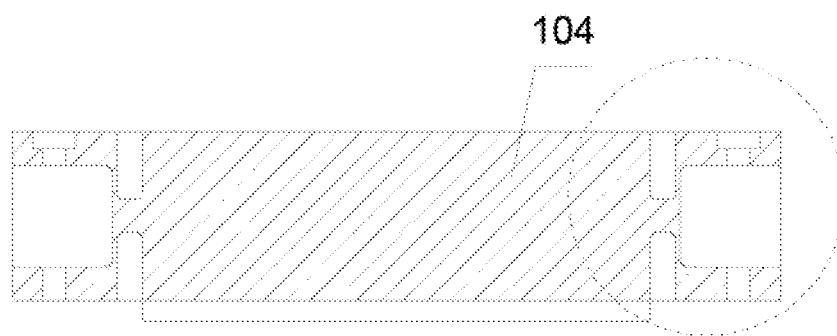
FIGS. 7a and 7b are a front sectional view and a local enlarged view of a guide mechanism.
Figure 7B:
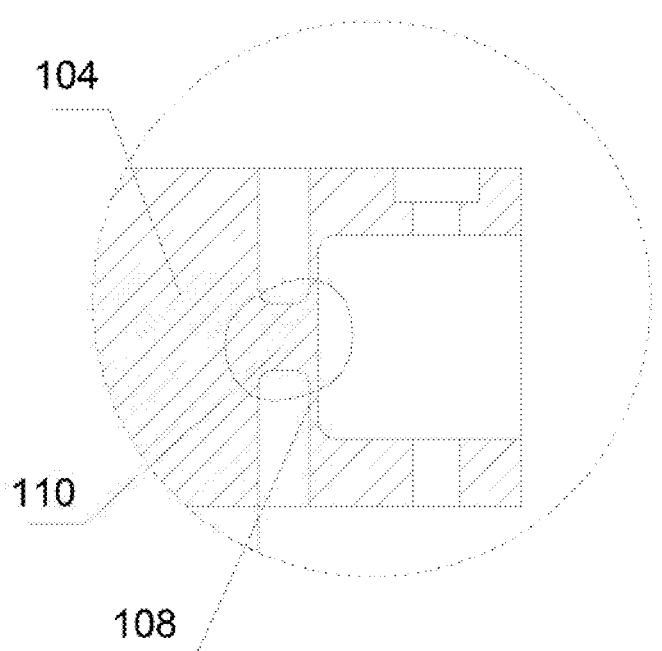

Working principles of the guide mechanism of the present embodiment are as follows. As shown in FIG. 6 and FIG. 7, the core motion platform 104 is connected with the rigid frame 102 through the primary flexible hinge group 106 and the secondary flexible hinge group 108 respectively. The flexible hinges in the primary flexible hinge group 106 and the secondary flexible hinge group 108 are integrally machined and manufactured with the rigid frame 102. The rigid frame 102, the core motion platform 104 and the primary flexible hinge group 106 are made of aviation aluminum or aviation aluminum alloy. The secondary flexible hinge group 108 is connected with the core motion platform 104 by a rigid connecting portion 110. The secondary flexible hinge group 108, the core motion platform 104 and the rigid connecting portion 110 are integrally formed. The secondary flexible hinge group 108, the rigid frame 102, the core motion platform 104 and the rigid connecting portion 110 are made of aviation aluminum or aviation aluminum alloy. Main working directions of the flexible hinges in the primary flexible hinge group 106 and the secondary flexible hinge group 108 are displacement directions of the core motion platform 104. The flexible hinges of the primary flexible hinge group 106 and the secondary flexible hinge group 108 have layout directions perpendicular to each other in a direction plane of the motion direction of the core motion platform 104 and are symmetrically arranged relative to the core motion platform 104, as shown in FIG. 7. The flexible hinges in the primary flexible hinge group 106 and the secondary flexible hinge group 108 arranged perpendicular to each other in a three-dimensional space can enhance mutual capabilities of bearing large loads and resisting deformation in the non-working direction.

Figure 8A:
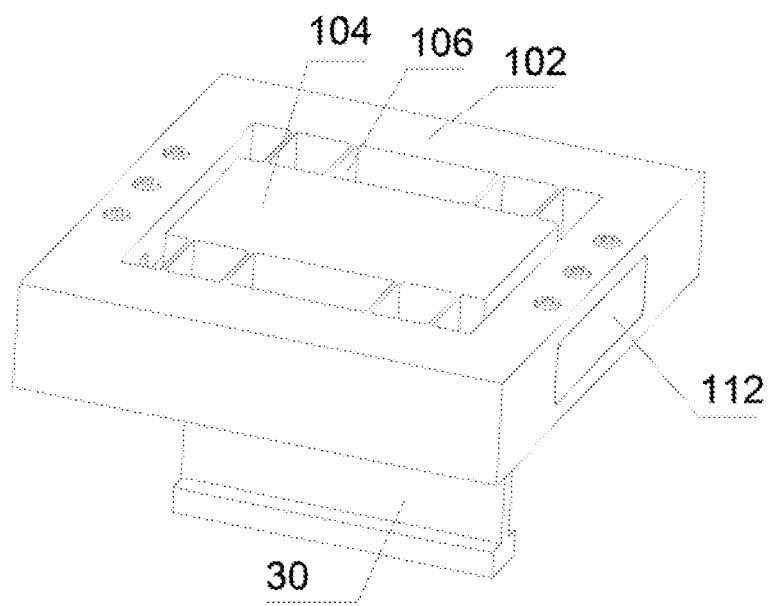
FIGS. 8a and 8b are axial sectional views of assembly bodies of a guide mechanism.
Figure 8B:
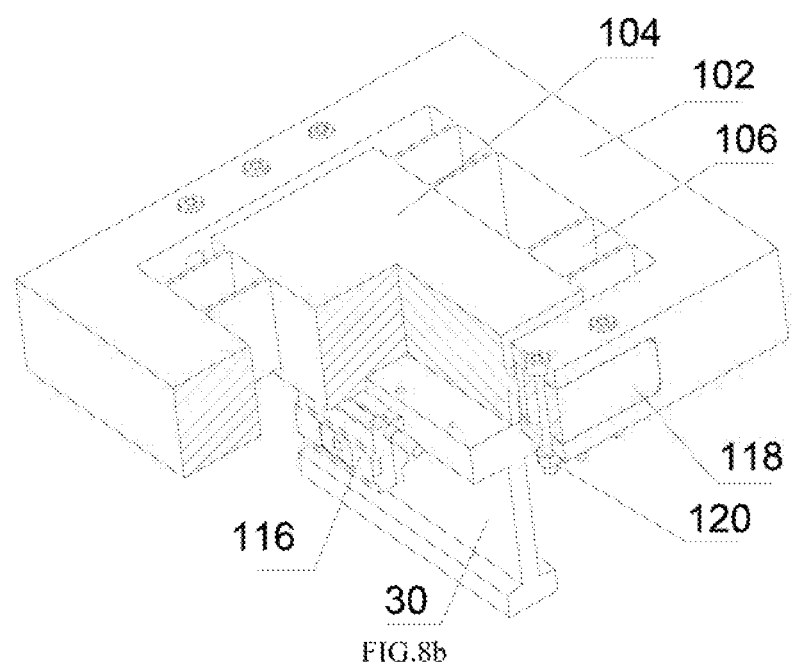
Figure 9A:
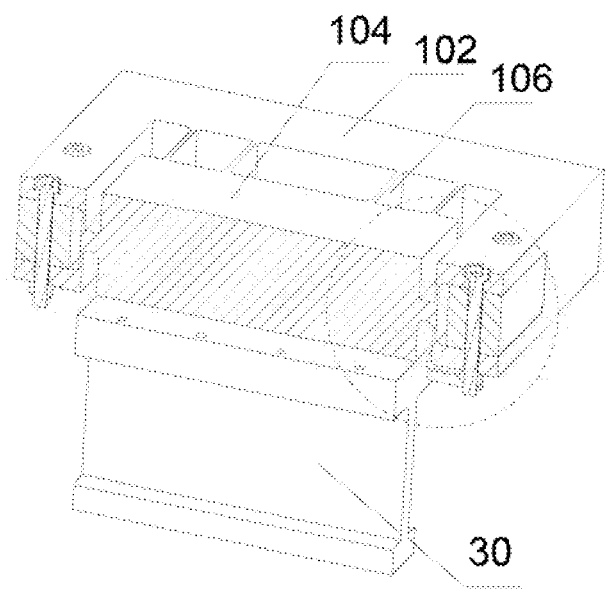
FIGS. 9a and 9b are an axial front sectional view and a local enlarged view of assembly bodies of a guide mechanism.
Figure 9B:
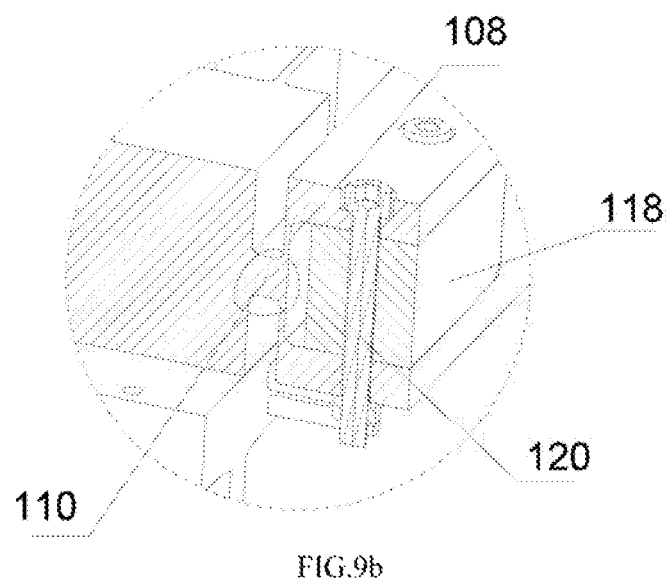

Further, as shown in FIG. 8 and FIG. 9, the core motion platform 104 is driven by the non-contact actuator 30, and a working displacement of the core motion platform 104 is measured by a grating displacement sensor 116. A deflection displacement caused by a torque of the non-contact actuator 30 acting on the core motion platform 104 is offset by the secondary flexible hinge group arranged symmetrically with the core motion platform 104. When the core motion platform 104 bears a large load, a sinking displacement of a motion platform 3 caused, by low rigidity of the primary flexible hinge group 106 in a vertical load direction is offset by the flexible hinges in the secondary flexible hinge group 108 symmetrically arranged relative to a horizontal center plane of the core motion platform 104. Through the above working principles, the core motion platform 104 can greatly improve the capabilities of bearing the large loads and resisting the deformation in the non-working direction in a rigidity enhancing manner of the secondary flexible hinge group.

Further, in the present embodiment, an opening 112 communicated with the secondary flexible hinge group 108 is formed in the rigid frame 102 for facilitating machining of the secondary flexible hinge group 108. The rigidity of the rigid frame 102 can be increased in such a manner that a weak portion of the rigid frame 102 caused by machining the secondary flexible hinge group 108 can be embedded with a rigid block 118 and is rigidly connected by a bolt group 120.

Apparently, the above embodiments of the present invention are only examples for clearly illustrating the present invention, rather than limiting embodiments of the present invention. Those ordinary skilled in the art can also make other different forms of changes or variations based on the above descriptions. All embodiments do not need to and cannot be illustrated exhaustively herein. Any modification, equivalent replacement, improvement and the like made within spirits and principles of the present invention should be included in a protection scope of the claims of the present invention.

We claim:

1. A multi-DOF (Degree of Freedom) large-stroke high-precision motion platform system, comprising a first rotating component, a second rotating component, a sliding component, a first single-DOF motion platform, a second single- DOF motion platform and a third single-DOF motion platform, wherein each of the single-DOF motion platforms comprises a base, a non-contact actuator and a guide mechanism;
    wherein the guide mechanism comprises:
        a rigid frame for generating a large-stroke displacement to realize high speed motion;
        a core motion platform arranged in the rigid frame and used for generating a small-stroke precise displacement in the rigid frame under driving of a non-contact actuator;
        a primary flexible hinge group arranged between the rigid frame and both sides of the core motion platform, and used for connecting the core motion platform to the rigid frame, supporting a load of the core motion platform and making the core motion platform generate a precise displacement through deformation along a motion direction; and
        a secondary flexible hinge group disposed between the rigid frame and the other two sides of the core motion platform, arranged perpendicular to the primary flexible hinge group, and used for connecting the core motion platform to the rigid frame, improving torsional deformation resistance of the core motion platform and allowing the core motion platform to generate a displacement along the motion direction, wherein flexible hinges of the secondary flexible hinge group are arranged symmetrically relative to the core motion platform; and the flexible hinges of the primary flexible hinge group are arranged symmetrically relative to the core motion platform;
    the first rotating component and the sliding component form a rotational sliding motion pair; and the rotational sliding motion pair is rigidly connected with the core motion platform in the first single-DOF motion platform and is rigidly connected with a base in the third single-DOF motion platform; and
    the second rotating component rigidly connected with a core motion platform in the second single-DOF motion platform and is rigidly connected with the base in the third single-DOF motion platform.

2. The multi-DOF large-stroke high-precision motion platform system according to claim 1, wherein the multi-DOF large-stroke high-precision motion platform further comprises a first connecting piece and a second connecting piece;
    the rotational sliding motion pair is rigidly connected with the base in the third single-DOF motion platform by the first connecting piece; and
    the second rotating component is rigidly connected with the base in the third single-DOF motion platform by the second connecting piece.

3. The multi-DOF large-stroke high-precision motion platform system according to claim 1, wherein both the first rotating component and the second rotating component are cross roller shaft rings.

4. The multi-DOF large-stroke high-precision motion platform system according to claim 1, wherein the sliding component is a short linear guide rail platform.

5. The multi-DOF large-stroke high-precision motion platform system according to claim 1, wherein each of the single-DOF motion platforms further comprises a linear guide rail; the rigid frame and the base form sliding pair connection by the linear guide rail; the core motion platform is connected with a motion portion of the non-contact actuator; and a fixed portion of the non-contact actuator is rigidly connected with the base.

6. The multi-DOF large-stroke high-precision motion platform system according to claim 1, wherein both the first single-DOF motion platform and the second single-DOF motion platform are arranged on a base.

7. The multi-DOF large-stroke high-precision motion platform system according to claim 1, wherein the rigid frame, the core motion platform and the primary flexible hinge group are integrally formed.

8. The multi-DOF large-stroke high-precision motion platform system according to claim 7, wherein the rigid frame, the core motion platform and the primary flexible hinge group are made of aviation aluminum or aviation aluminum alloy.

9. The multi-DOF large-stroke high-precision motion platform system according to claim 1, wherein the secondary flexible hinge group and the rigid frame are integrally formed.

10. The multi-DOF large-stroke high-precision motion platform system according to claim 9, wherein the guide mechanism further comprises a rigid connecting portion; and the core motion platform is connected with the secondary flexible hinge group by the rigid connecting portion.

11. The multi-DOF large-stroke high-precision motion platform system according to claim 10, wherein the secondary flexible hinge group, the core motion platform and the rigid connecting portion are integrally formed.

12. The multi-DOF large-stroke high-precision motion platform system according to claim 11, wherein the secondary flexible hinge group, the rigid frame, the core motion platform and the rigid connecting portion are made of aviation aluminum or aviation aluminum alloy.

13. The multi-DOF large-stroke high-precision motion platform system according to claim 9, wherein an opening communicated with the secondary flexible hinge group is formed in the rigid frame; and the guide mechanism further comprises a rigid block embedded into the opening and rigidly connected with the rigid frame to increase rigidity of a weak portion generated by the rigid frame when machining the secondary flexible hinge group.

* * * * *